(12) United States Patent  (10) Patent No.: US 7,517,240 B2
Ma                          (45) Date of Patent:     Apr. 14, 2009

(54) FINE PITCH ELECTRICAL CONNECTOR

(75) Inventor: Hao-Yun Ma, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/012,082

(22) Filed: Jan. 31, 2008

(65) Prior Publication Data

US 2008/0182446 A1    Jul. 31, 2008

(30) Foreign Application Priority Data

Jan. 31, 2007  (CN) .................... 2007 1 0019695

(51) Int. Cl.
*H01R 4/50* (2006.01)

(52) U.S. Cl. .................... 439/342; 439/733.1

(58) Field of Classification Search ................ 439/342, 439/733.1
See application file for complete search history.

(56) References Cited

U.S. PATENT DOCUMENTS

| 5,597,319 A * | 1/1997 | Scheitz et al. ........... 439/342 |
| 6,152,757 A * | 11/2000 | Szu ....................... 439/342 |
| 6,283,782 B1 * | 9/2001 | Yahiro et al. ............. 439/342 |
| 7,361,044 B1 * | 4/2008 | Pandey et al. ............ 439/342 |

\* cited by examiner

*Primary Examiner*—Tho D Ta
(74) *Attorney, Agent, or Firm*—Wei Te Chung

(57) ABSTRACT

A fine pitch electrical connector includes an insulative housing and a lot of contacts received in the housing. The housing defines a mating surface, a mounting surface opposite to the mating surface, and at least four passageways arranged between the mating surface and the mounting surface. Each contact comprises a retaining portion secured in a passageway and a contacting portion extending therefrom and located in the passageway. Each passageway communicates with adjacent passageway via a slot. When an IC module is assembled to the connector, pins of the IC module each are disposed partially into a passageway and partially into a slot.

5 Claims, 4 Drawing Sheets

FINE PITCH ELECTRICAL CONNECTOR

BACKGROUND OF THE INVENTION

1. Field of the Invention

The present invention relates to an electrical connector, and more particularly to a fine pitch electrical connector, which provides a high density electrical connector.

2. Background of the Invention

Various electronic systems, such as computer, comprise a wide array of components mounted on printed circuit boards, such as daughterboards and motherboards, which are interconnected to transfer signals and power throughout the system. The transfer of signals and power between the circuit boards requires electrical interconnection between the circuit boards. Certain interconnections include a socket assembly, e.g. a Zero Insertion Force (ZIF) electrical connectors socket and a plug assembly, e.g. an IC module, e.g. a CPU module.

Typical conventional ZIF connectors are disclosed in Chinese Patent Nos. 03262254.6, 03251142.6 and 03262254.6. Each of these connectors generally comprises a base connected to a PCB, a movable cover mounted on the base and a driving mechanism. The base includes a plurality of passageways and a plurality of conductive contacts received therein. The cover includes a plurality of through holes corresponding to said passageways in the base. The driving mechanism is used to drive the cover to move from an open position to a closed position. When the cover is at the open position, pins of the IC are inserted into the through holes of the cover and the passageways of the base. At this time, the pins do not contact with any conductive contacts, and the passageways each need enough space that ensures the pins to be inserted into. When the cover is at the closed position, the IC is electrically connected with the PCB by the pins close contacting with the conductive contacts, and the space the pins occupied pried occurs surplus roomage.

Conventional ZIF connectors need the space of the passageways of the base big enough, thus ensuring the pins of the IC module to be inserted into. As the electronic systems become more sophisticated, the systems require an increasing number of contacts and equally increasing number of pins. Thus, as electronic systems become more advanced, the quantity of conductive contacts with the connector increase. Accordingly, the ZIF connector becomes bigger, so as to have more and more conductive contacts, but it is hardly to implement. Additionally, if the ZIF connector remains certain desired volume, density of the conductive contacts must be increased in a limited space. In a word, such connector is hardly to form a fine pitch connector, which is a high density connector used in a limited space.

In view of the foregoing, such electrical connector with improvement is provided to increase density of the conductive contacts.

SUMMARY OF THE INVENTION

Accordingly, an object of the present invention is to provide a fine pitch electrical connector for electrically connecting an IC module to a PCB, which ensures a small pitch between adjacent contact such that provides a high density connector.

To achieve above-mentioned object, a fine pitch electrical connector according to the present invention is provided. The electrical connector includes an insulative housing and a lot of contacts received in the housing. The housing defines a mating surface, a mounting surface opposite to the mating surface, and at least four passageways arranged between the mating surface and the mounting surface. Each contact comprises a retaining portion secured in a passageway and a contacting portion extending therefrom and located in the passageway. Each passageway communicates with adjacent passageway via a slot. When an IC module is assembled to the connector, pins of the IC module each are disposed partially into a passageway and partially into a slot.

DETAILED DESCRIPTION OF THE PREFERRED EMBODIMENT OF THE INVENTION

Figure 1:
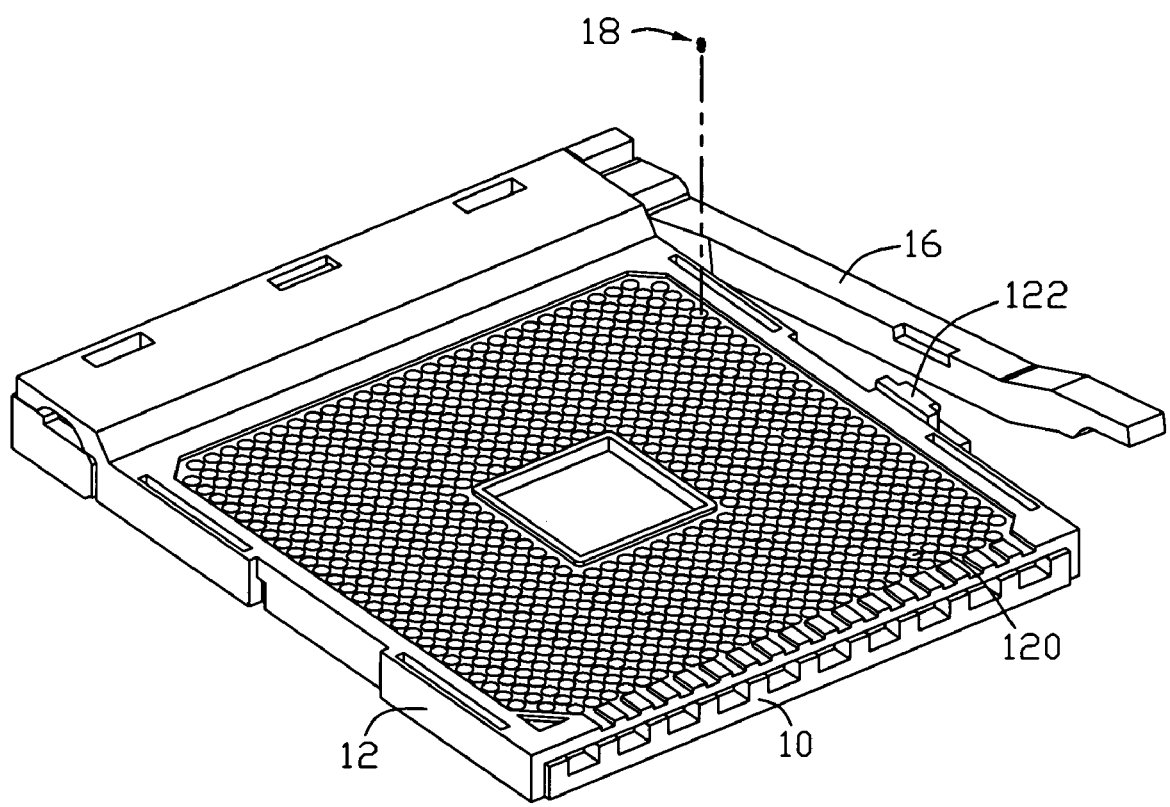
FIG. 1 is an assembled view of an electrical connector according to the present invention.

A preferred embodiment of the present invention will be described hereunder with reference to the accompanying drawings.

Referring to FIGS. 1-4, an electrical connector 1 of the present invention for establishing an electrical connection between an IC package and a PCB is provided. The connector 1 comprises a insulative housing 10 connected to a PCB (not shown), a cover 12 movably mounted on the insulative housing 10, an actuator 14 arranged between the insulative housing 10 and the cover 12, and a plurality of contacts 18 received in the insulative housing 10.

Figure 2:
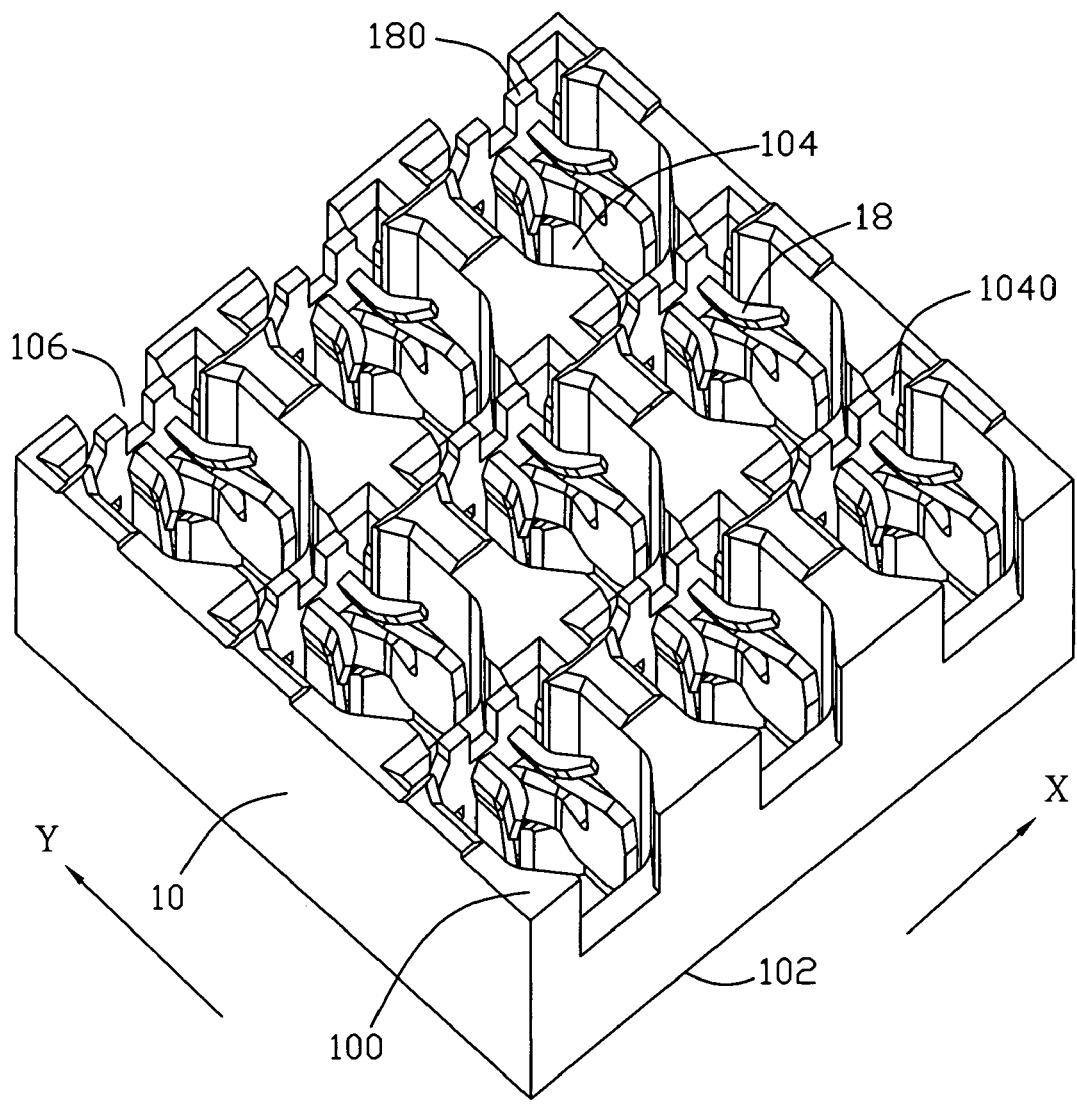
FIG. 2 is an isometric view of a portion of the electrical connector having contacts according to the present invention.
Figure 3:
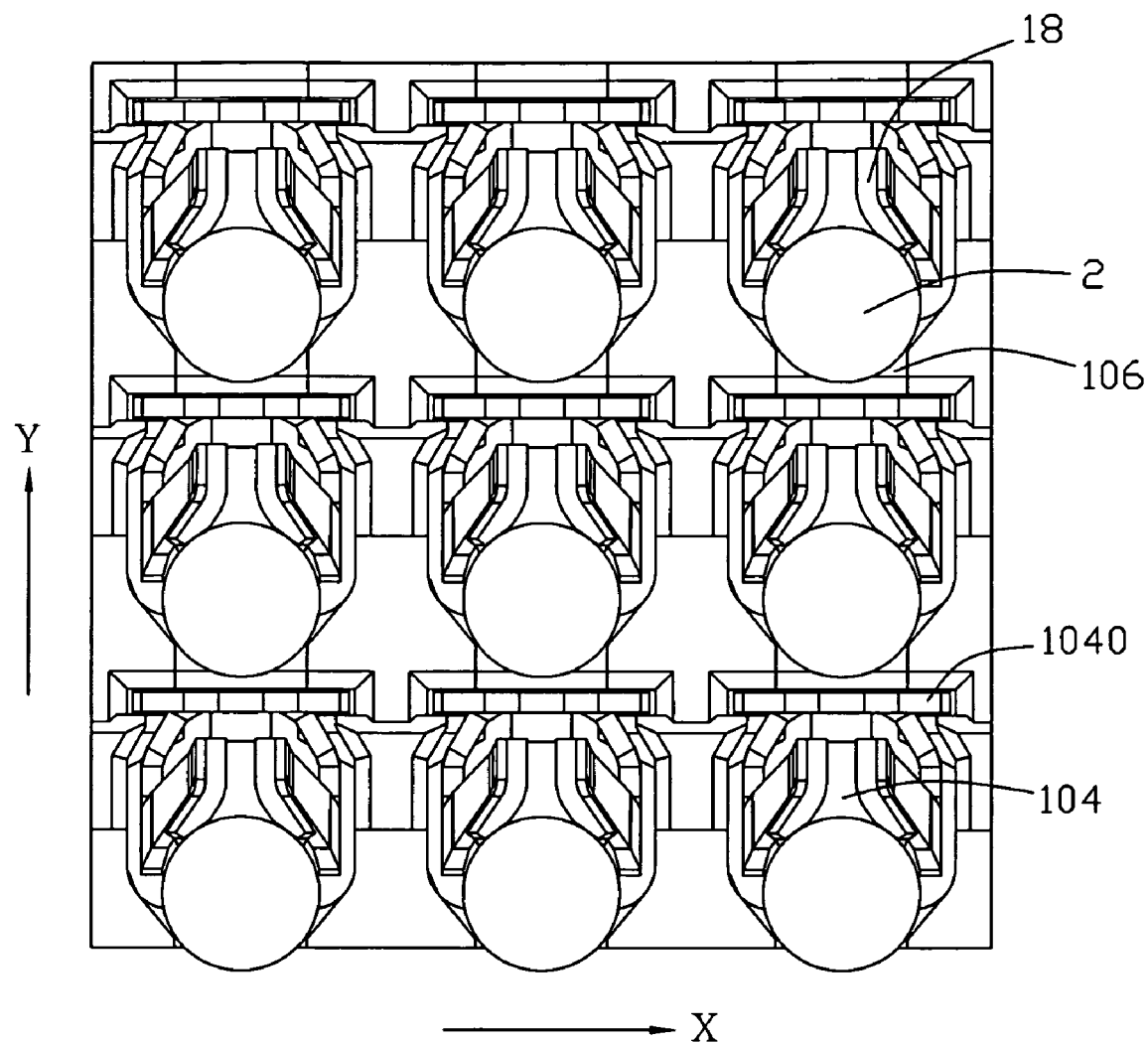
FIG. 3 is top plan view thereof, wherein the contacts mate with pins of an IC.

The insulative housing 10 defines a mating surface 100 for supporting the cover 12, a mounting surface 102 opposite to the mating surface 100, and a plurality of passageways 104 arranged between the mating surface 100 and the mounting surface 102. The passageways 104 are arranged in a crossed pattern and each passageway 104 comprises a guiding slot 1040 arranged in one side thereof. Referring to FIGS. 2 and 3, the passageways 104 in the pattern forms substantially evenly distributed rows (aligned with the arrow X) and columns (aligned with the arrow Y) of passageways 104 spaced from one another. The insulative housing 10 defines a plurality of slot 106 arranged between every two adjacent passageways of each column. Each slot 106 communicates with two adjacent passageways 104, wherein the guiding slot 1040 arranged in one side of the passageway 104 communicates with adjacent passageway 104 via said slot 106.

Figure 4:
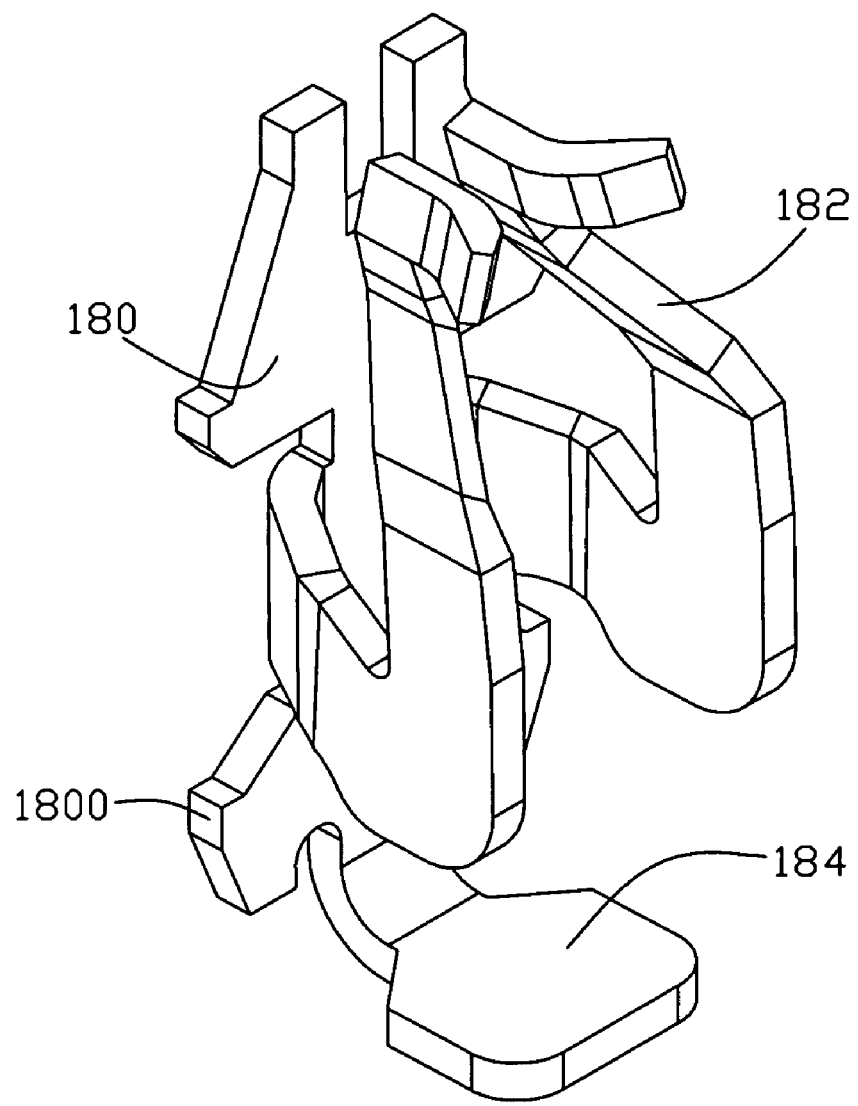
FIG. 4 is an isometric view of an electrical contact according to the present invention.

Referring to the FIG. 4, the contact 18 comprises a retaining portion 180 secured in the guiding slot 1040 of the passageway 104, a contacting portion 182 extending from the retaining portion 180 and located in the passageway 104, and a soldering portion 184 extending from upper end of the retaining portion 180. The retaining portion 180 comprises a number of bars 1800 ensuring the retaining portion 180 to be secured in the guiding slot 1040. The contacting portion 182 comprises a pair of contacting arms extending symmetrically from the retaining portion 180.

The cover 12 mounted the insulative housing 10 comprises a plurality of through holes 120 corresponding to the passageways 104 of the housing 10 and ensuring the pins 2 of the IC module to be inserted into. The cover 12 defines an anchor 122 engageably with the actuator 16.

The actuator 16 is arranged between the insulative housing 10 and the cover 12. The actuator 16 is used for driving the cover 12 to slide relative to the insulative housing 10 from a first position to a second position. When the cover 12 is at the first position, pins 2 of the IC module are inserted into the through holes 120 of the cover 12 and the passageways 104 of the housing 10. When the cover 12 is at the second position, the pins 2 are electrically connected with the PCB by the pins 2 close contacting with the contacts 18. And, when the cover 12 is at the second position, the anchor 122 of the cover 12 engages with the actuator 16, so as to position the cover 12 in the second position.

Referring to FIG. 3, while the electrical connector 1 mate with an IC module (not shown), the IC module will be disposed on the cover 12. Pins 2 of the IC module are inserted into the passageways 104. The pins 2 each are disposed partially into the passageway 104 and partially into the slot 106. Accordingly, the space of the passageway 104 that ensures the pins 2 of the IC module to be inserted into the passageway 104 could be smaller under a same condition. In other words, distance between two adjacent contacts 18 of each row is smaller than before, so the connector 1 could have more contacts 18 in a certain desired volume. Accordingly, a fine pitch connector 1, which provides a high-density electrical connector system, is provided. When the standard of the connector is fixed, the fine pitch connector 1 can has more contacts 18 than a conventional connector that pins of IC module are inserted into the passageway thereof completely. Accordingly, the connector 1 according to the present invention provides a high-density electrical connector system, which is easily to implement.

I claim:

1. A fine pitch electrical connector comprising:
    an insulative housing, defining a mating surface, a mounting surface opposite to the mating surface, and at least four passageways arranged between the mating surface and mounting surface;
    at least four contacts each comprising a retaining portion secured in a passageway and a contacting portion extending therefrom and located in the passageway;
    wherein each passageway communicates with adjacent passageway via a slot;
    wherein the passageways are arranged in a crossed pattern;
    the passageway further comprises a guiding slot receiving the retaining portions of the contact;
    wherein the passageways are spaced from each other in direction of the row;
    wherein the each passageway of each column communicates with two adjacent passageways;
    wherein the guiding slot arranged in one side of the passageway communicates with adjacent passageway via said slot;
    wherein the contacting portion of each contact comprises a pair of contacting arms.

2. An electrical system comprising:
    an electrical connector comprising:
    an inuslative housing, defining a mating surface, a mounting surface opposite to the mating surface, and at least two passageways arranged between the mating surface and mounting surface; at least two contacts each comprising a retaining portion secured in a passageway and a contacting portion extending there from and located in the passageway;
    a slot arranged between two adjacent passageways; and
    an IC module assembled to the connector, including at least two pin legs each disposed partially into the passageway and partially into the slot;
    the passageway further comprises a guiding slot receiving the retaining portions of the contact;
    wherein the each passageway of each column communicates with two adjacent passageways;
    wherein the guiding slot arranged in one side of the passageway communicates with adjacent passageway via said slot;
    wherein the contacting portion of each contact comprises a pair of contacting arms.

3. The electrical system as claimed in claim 2, further comprising a cover mounted on the housing and movably from a first position to a second position, the cover comprising at least two through holes corresponding to the passageways and ensuring the pins of the IC module to be inserted into.

4. An electrical system comprising:
    an electrical connector comprising an inuslative housing, and a cover moveably assembled to the housing to move from a first position to a second position, at least four passageways arranged in row and column within the housing, each passageway received a contact with a contacting portion and a retention portion located in the passageway, each passageway communicating with an adjacent passageway with an open space; and
    an IC module disposed on the cover and including at least four pin legs inserted into the passageways to electrically connect with the contact portion and partially extending into the open space when the cover is positioned in a second position;
    the passageway further comprises a guiding slot receiving the retaining portions of the contact;
    wherein the each passageway of each column communicates with two adjacent passageways;
    wherein the guiding slot arranged in one side of the passageway communicates with adjacent passageway via said slot;
    wherein the contacting portion of each contact comprises a pair of contacting arms.

5. The electrical connector as claimed in claim 4, wherein the retention portion of the contact is located adjacent to the corresponding slot so as to isolate a corresponding CPU pin, which is inserted into the corresponding passageway, from said adjacent passageway.

* * * * *